United States Patent
Sibrai et al.

(10) Patent No.: US 6,741,137 B1
(45) Date of Patent: May 25, 2004

(54) HIGH QUALITY SERIAL RESONANCE OSCILLATOR

(75) Inventors: Andreas Sibrai, Krottendorf (AT); Kurt Fritzwenwallner, St. Johann (AT)

(73) Assignee: Dialog Semiconductor GmbH, Kirchheim/Teck-Nabern (*) Notice: Subject to any disclaimer, the term of this patent is extended or adjusted under 35 U.S.C. 154(b) by 0 days.

(21) Appl. No.: 10/336,872

(22) Filed: Jan. 6, 2003

(30) Foreign Application Priority Data

Dec. 17, 2002 (EP) .............................. 02368134

(51) Int. Cl.$^7$ ................................. H03B 5/00
(52) U.S. Cl. ................ 331/109; 331/158; 331/160; 331/183
(58) Field of Search .................. 331/109, 182, 331/183, 116 R, 158, 160, 185, 186, 177 R (56) References Cited

U.S. PATENT DOCUMENTS

| | | | |
|---|---|---|---|
| 3,979,693 A | 9/1976 | Saari | 331/61 |
| 3,996,530 A | 12/1976 | Feistel et al. | 331/116 R |
| 4,028,638 A | * 6/1977 | Towle | 331/109 |
| 5,834,983 A | * 11/1998 | Higgins, Jr. | 331/109 |
| 5,933,057 A | 8/1999 | Tchamov et al. | 330/302 |
| 6,052,036 A | 4/2000 | Enström et al. | 331/176 |
| 6,194,973 B1 | 2/2001 | Williamson | 331/109 |
| 6,259,333 B1 | 7/2001 | Shimono | 331/116 R |
| 6,278,338 B1 | 8/2001 | Jansson | 331/116 FE |

OTHER PUBLICATIONS

"CMOS Analog Integrated Circuits Based on Weak Inversion Operation", Eric Vittoz et al., IEEE Journal of Solid-State Circuits, vol. SC–12, No. 3, Jun. 1977, pp. 224–231.
Eric Vittox et al., CMOS Analog Integrated Circuits Based on Weak Inversion Operation, IEEE Journal of Solid–State Circuits, vol. SC–12, No. 3, Jun. 1977, pp. 224–231.

* cited by examiner

Primary Examiner—Robert Pascal
Assistant Examiner—Joseph Chang
(74) Attorney, Agent, or Firm—George O. Saile; Stephen B. Ackerman (57) ABSTRACT

A highly stable single chip resonator controlled oscillator with automatic gain control designed for manufacture in monolithic integrated circuit technologies. An automatic gain controller monitors the output of a crystal controlled oscillator amplifier and produces a feedback signal to ensure oscillation is induced at startup and that the amplitude of oscillation is continuously controlled during operation to reach low phase noise and reduce power consumption of the circuit.

44 Claims, 9 Drawing Sheets

HIGH QUALITY SERIAL RESONANCE OSCILLATOR

BACKGROUND OF THE INVENTION (1) Field of the Invention

The invention relates generally to electronic oscillators and in particular to improved crystal resonator, thin-film resonator or micro electromechanical resonator oscillators, realized with monolithic integrated-circuit technologies, where one chip solutions include automatic gain control to accommodate a highly accurate frequency-generation exhibiting low phase noise and stable amplitudes at higher frequencies.

(2) Description of the Prior Art

Most crystal oscillators in monolithic integrated circuit technology are developed using Pierce oscillator circuit schemes, where the frequency determining resonator is working in parallel resonance mode. Realized with quartz crystals as resonators normally only narrow band tuning is featured and phase noise is considered sufficiently good at frequency offsets not too far away from the oscillator carrier signal. It would be advantageous to extend the tuning range whilst maintaining a good phase noise behaviour at far away offsets.

Crystal-controlled oscillators have been in use for decades in electronic systems as frequency references; but such oscillators have mostly been implemented using bi-polar transistors as active elements. However, the dominant technology for the fabrication of most integrated circuits today is CMOS and design techniques for highly stable crystal oscillators in this technology are less well known, especially when it comes to frequencies of about 100 MHz, as necessary for modem communication applications.

In the prior art, there are different technical approaches for achieving the goals of good tuneability and low phase noise. These crystal oscillator arrangements always include a piezo-electric, e.g. quartz, crystal and drive current means therefore. Unfortunately, these approaches are somewhat expensive, both in terms of technical complexity (e.g. differential push-pull or balanced bridge structures, extra filter or tank circuits, sophisticated temperature compensation or gain control circuits, amplitude peak detectors etc.) and hence commercial costs. It would be advantageous to reduce both expenses. This is achieved by using an oscillator circuit working with a crystal in serial resonance mode, originating from Butler. Using the intrinsic advantages of that solution—as described later on in every detail—the circuit of the invention is realized with standard CMOS technology at low cost.

Several prior art inventions describe related crystal oscillators.

U.S. Patent (U.S. Pat. No. 3,996,530 to Feistel et al.) describes a Butler oscillator with an amplitude limiting amplifier followed by a filter network interposed between the voltage amplification stage and the impedance matching stage. This allows both the voltage amplification stage and the impedance matching stage to be operated in a linear mode at all times which assures that a piezoelectric crystal connected between the stages is connected in a relatively low, constant impedance path and is driven by a sinusoidal waveform, free of distortion, to assure maximum frequency stability.

The circuit of the invention is realized using bipolar technology.

U.S. Patent (U.S. Pat. No. 6,052,036 to Enstrom et al.) discloses a highly stable single chip crystal controlled oscillator with automatic gain control and on-chip tuning. An amplitude detector monitors the output of a crystal controlled oscillator amplifier and produces a feedback signal proportional to the output signal of the amplifier to ensure oscillation is induced at startup and that the amplitude of oscillation is limited to a preselected value during operation to conserve power consumption by the amplifier. The capacitor tank circuit connected to the input of the amplifier includes a voltage variable capacitor the voltage across which is initially established at manufacture to tune the oscillation frequency to a preselected value. The voltage across the voltage variable capacitor is also adjusted to compensate for temperature variations in the circuit.

U.S. Pat. No. 6,194,973 to Williamson) shows an oscillator with automatic gain control, where an oscillator having an adjustable gain circuit provides abundant gain when the oscillator is first powered up but reduces the gain substantially below its start-up value once oscillations build up, thereby substantially reducing the power consumed. The oscillator comprises an inverting amplifier coupled to a resonator, an oscillation detector coupled to the inverting amplifier amplifier, and a common-gate amplifier coupled to the oscillation detector. The inverting amplifier amplifies oscillations of the resonator according to a gain. The oscillation detector outputs a detection signal in response to oscillations of the resonator. The level of the detection signal is proportional to the amplitude of the oscillations. The common-gate amplifier receives the detection signal and, in response, limits the current to the inverting amplifier to control the gain based on the level of the detection signal.

U.S. Patent (U.S. Pat. No. 6,259,333 to Shimono) describes a temperature compensated quartz oscillator. A system that provides an accurate frequency generating source, avoids mode coupling of the quartz vibrator, and has a high production efficiency. A high frequency amplifying circuit uses a bridge circuit as part of a feedback circuit, and a quartz vibrator is inserted in a branch side connecting the CR-circuit. The oscillation frequency is less than the serial resonance frequency of the quartz vibrator.

U.S. Patent (U.S. Pat. No. 6,278,338 to Jansson) discloses a crystal oscillator with peak detector amplitude control. A crystal oscillator apparatus is described that has a wide dynamic frequency range and that is capable of supporting a broad range of crystal types. The present invention reduces the unwanted side effects that are associated with the prior art crystal oscillator designs, such as the clipping of signals, the introduction of signal distortion and unwanted signal harmonics. The present invention reduces the total wasted loop gain of the oscillator while also reducing the amount of integrated circuit real estate required to implement the crystal oscillator. The crystal oscillator apparatus of the present invention preferably comprises a crystal resonator circuit, an inverting amplifier, a bias circuit, a reference circuit, and a peak detector circuit. The present invention takes advantage of automatic gain control design techniques. The gain of the present crystal oscillator is automatically regulated using a closed loop circuit design. The present invention advantageously utilizes a peak detector circuit in combination with a reference circuit. The peak detector compares a reference signal with an amplified and inverted oscillation signal produced by a crystal resonator, and generates a feedback signal as a result of the comparison. The feedback signal controls a bias circuit that, in turn, controls the amplified inverted oscillation signal.

In that invention cited here, the crystal is being operated in a parallel resonance Pierce oscillator configuration.

In the paper from Vittoz et al.—cited here as [Vittoz, et al., "CMOS Analog Integrated Circuits Based on Weak Inversion Operation", IEEE Journal of Solid-State Circuits, vol. SC-12, No. 3, June 1977. pp. 224–231. ]—an automatic gain control circuit is described, the disadvantage of the tuned small band operation of this circuit however is avoided in the current invention.

SUMMARY OF THE INVENTION

A principal object of the present invention is to provide an effective and very manufacturable method and circuit for generating resonator stabilized oscillation signals. The results are especially applicable and very efficient for use with resonators at least made up of Quartz or Piezo crystals, or of Thin-Film Resonators (TFR) or Micro Electro Mechanical System (MEMS) resonators but not restricted to only those types of resonators.

A further object of the present invention is to attain a low amplitude distortion of the oscillator signal.

Another still further object of the present invention is to reach a low phase noise behaviour of the circuit, i.e. to substantially enhance its frequency stability.

Also an object of this invention is the starting up of the generation process of the oscillation signal at maximum speed.

Another object of this invention is minimizing the distortion and the phase noise of the generated oscillation signal in steady state operation.

A still further object of the present invention is to reduce the power consumption of the oscillator circuit by realizing inherent appropriate design features.

Another further object of the present invention is to reduce the cost of manufacturing by implementing the circuit as a monolithic integrated circuit in low cost CMOS technology.

Another still further object of the present invention is to reduce cost by minimizing the chip area by means of effectively minimizing capacitance values.

In accordance with the objects of this invention, a circuit, capable of generating a stable, resonator controlled oscillation signal is achieved. Said circuit comprises means for generating an oscillating signal having a stable and predetermined oscillation frequency with means for driving said oscillation generating means and for matching the impedance levels between said oscillation generating means and this driving means. Also comprised are means for amplifying and controlling said generated oscillation signal of said oscillation generating means. The circuit further comprises means for connecting said amplifying and controlling means to said driving means in a closed loop feedback fashion. Still further comprised are means, coupled between said driving means and said amplifying means for controlling the amplification factor (gain) of said amplifying means in such a way, that a steady oscillation signal is maintained and means for isolating said amplified oscillation signal of said amplifying means from influences resulting from changing output loads at said isolating means. Finally are comprised means for generating the bias currents, based upon the supply voltage level, for said driving means and for said isolating means.

Still in accordance with the objects of this invention, a method for generating a stable, amplitude controlled oscillation signal with an electronic device or technology is given. Said method includes providing a resonator element for determining of the oscillator frequency and providing a White cascode buffer circuit for driving this resonator element. The method further comprises providing a common gate amplifier circuit for amplifying the oscillation signal together with providing an automatic gain control circuit for stabilizing the oscillation signal. Also included in the method is providing an output buffer circuit for isolating the oscillator circuit from load influences and providing a bias block circuit for delivering the biasing reference currents for the buffer circuits. The method is equally essential for controlling the closed loop generation of the oscillations.

BRIEF DESCRIPTION OF THE DRAWINGS

In the accompanying drawings forming a material part of this description, the details of the invention are shown.

DESCRIPTION OF THE PREFERRED EMBODIMENTS

The preferred embodiments disclose a novel circuit for a crystal oscillator and a method of controlling amplitude and frequency of said oscillator.

The description of the preferred embodiments of the invention is subdivided in two steps; firstly an overall description of the whole circuit and a short explanation of every functional circuit block is given and secondly a much more detailed description of each said functional circuit block together with its precise circuit schematics is following.

Figure 1:
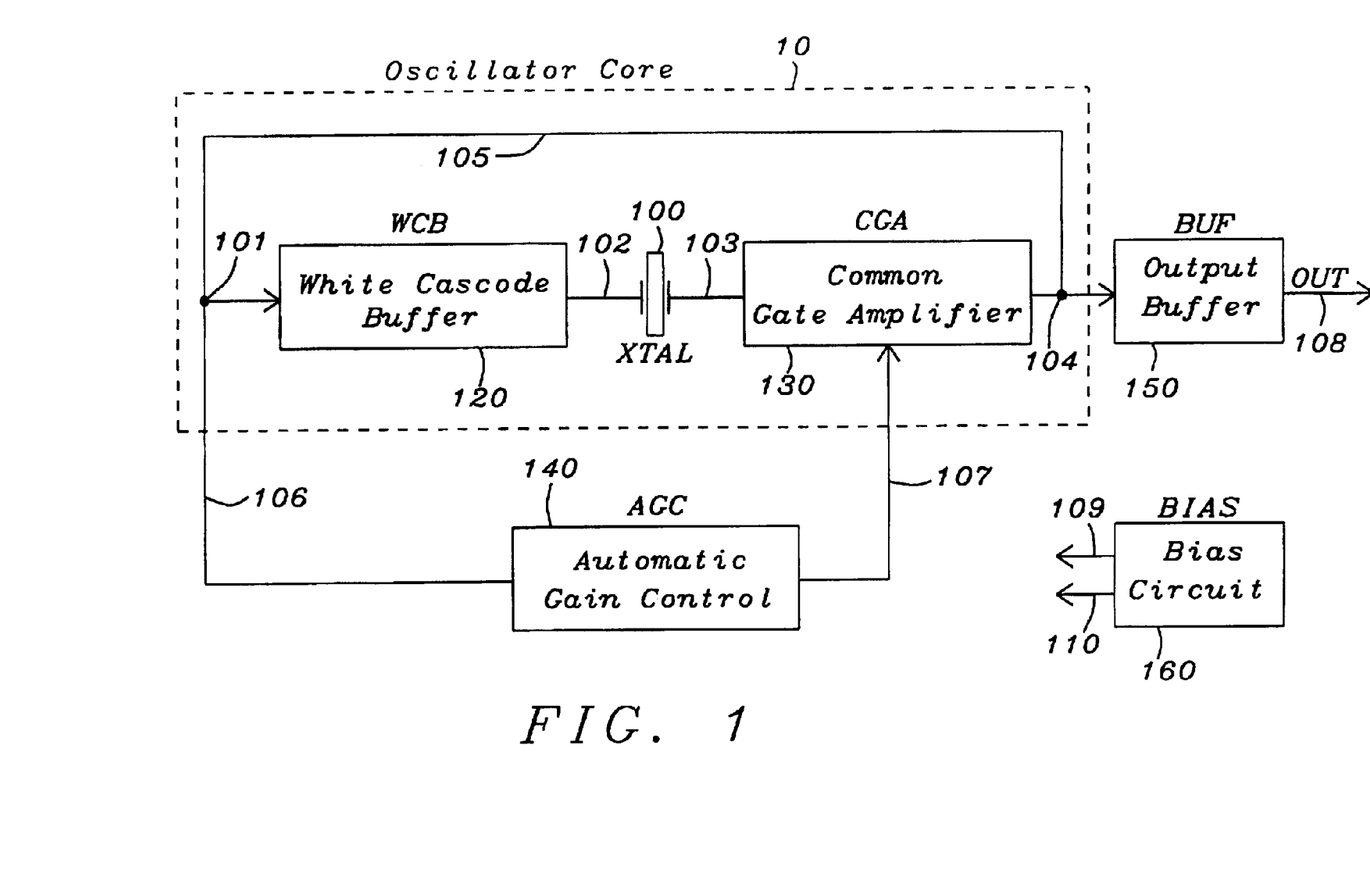
FIG. 1 illustrates the building blocks for the preferred embodiment of the present invention. The block diagram shows all five essential circuit blocks realizable with modern monolithic integrated-circuit technologies.

Referring now to FIG. 1, the preferred embodiment of the circuit of the present invention is illustrated. The essential functional components of the oscillator according to the invention are shown in FIG. 1 in the form of a block diagram. The oscillator core 10 consists of the resonating—in this special case—crystal (XTAL) 100 device, embedded between an internal White cascode buffer (WCB) block 120 on one side of the XTAL 100—designated as first XTAL pin 102—and a common gate amplifier (CGA) block 130 on the other side of the XTAL 100—designated as second XTAL pin 103. The output signal 104 of the Common Gate Amplifier block (CGA) 130 is then fed back via lead 105 to the input 101 of the internal cascode buffer block (WCB) 120. This same output signal 104 is further used as input signal 106 for an automatic gain control (AGC) circuit block 140, which in turn controls via connection 107 the common gate amplifier (CGA) block 130. The output 104 of the oscillator core 10 is then connected via the external output buffer (BUF) block 150 to the output pin named OUT of the oscillator circuit 108. A further necessary part of the whole oscillator circuit is depicted in the separate biasing circuit (BIAS) block 160, with its two output leads 109 and 110, where lead 109 delivers the biasing current for the cascode buffer WCB block 120 and lead 110 the biasing current for the output buffer BUF block 150.

The abbreviations for the circuit block names given in brackets are for mnemonic purposes and for future reference. A short description of every circuit block follows here, more detailed explanations are given later:

1. Item 100 in FIG. 1: Quartz Crystal Resonator (XTAL)

This block represents here—chosen as a special case—a quartz crystal (XTAL) resonator, which can be in general any resonator type (TFR, MEMS etc.) and which may normally be connected externally to the integrated circuit, as a so called Off-Chip part. Nevertheless for low cost solutions an On-Chip integration of the resonator device is also feasible, yet with a somewhat reduced stability performance of the circuit.

Especially resonators of type TFR should be integrated on the chip as MEMS or in a similar third dimension build-up technology. The circuit is designed in this illustrative example to nominally operate with a crystal of about 13 MHz resonance frequency, utilizing its serial resonance mode. The generated frequency depends entirely on the crystal and the current structure can operate with any type of crystal and in case of a quartz crystals (XTAL) at XTAL resonance frequencies from about 1 MHz to about 50 MHz. Nevertheless the principles shown here can be expanded further to frequencies ranging from kHz to GHz, utilizing other types of resonators.

The equivalent circuit model of the XTAL and the values of its components are provided by the XTAL manufacturer. For the equivalent circuit model used and its description refer to FIG. 2 below. FIGS. 3A and 3B depict the impedance vs. frequency diagrams of the XTAL.

2. Item 10 in FIG. 1: Oscillator Core:

The circuit blocks enclosed within the dashed rectangle 10 are considered as absolutely essential for the oscillator and are designated as core of the oscillator, the circuit of which was originally suggested by Butler [F. Butler, "Series-Resonant Crystal Oscillators", Wireless Engineer, June 1946, pp. 157–160] and which is modified here.

Any oscillator, RC, LC or crystal—controlled, requires two conditions to be met for it to operate at the desired oscillator frequency; its loop gain must be greater than unity at the oscillator frequency and its close-loop phase shift must be zero (or 2n radians where n=0 or a whole integer). Within this oscillator core these amplitude and phase conditions for steady oscillations are established and maintained. This core in a whole constitutes an amplifier with positive feedback. The necessary amplitude condition for oscillations is therefore fulfilled by adjusting the gain of the amplifier. The components of the amplifier make up—together with the XTAL—the resonant effective part of the chip. The feedback of the amplifier and all frequency dependent components within the core determine the correct phase conditions for oscillations. For the detailed electrical circuit schematics refer to FIG. 4.

3. Item 140 in FIG. 1: Automatic Gain Control (AGC)

The circuit block for automatic gain control includes the following functions:

a) maintaining a constant voltage amplitude of the oscillator signal, b) preventing an amplitude modulation of the oscillator signal, which can be considered a side effect from frequency instability, i.e. phase noise, assuming a fast start-up process of the oscillator and keeping the quiescent current of the main amplifying transistor (determined by the transconductance $g_m$ of the MOSFET) constant. Where the transconductance $g_m$ is defined as $g_m = \Delta I_D / \Delta V_{GS}$ with [S] as units. $I_D$ being the DC drain current and $V_{GS}$ being the DC gate-source voltage of the field effect transistor (FET). This can be expressed also in AC quantities as $g_m = I_d / V_{gs}$; where rearranging the terms leads to $I_d = g_m * V_{gs}$ ([S]=siemens=1/ohm=1/[Ω]).

These above enumerated principal goals for the design of the AGC block shall assure the proper and fast start-up process of the oscillator, must avoid any unwanted amplitude modulation in the steady state, and will also stabilize the generated amplitude of the signal. The succesful achievement of these design goals is reached through a close tracking of the generated oscillator core signal and by adjusting the quiescent current of the common gate amplifier (CGA), i.e. controlling the transconductance $g_m$ and the gain of the transistor. A more thorough explanation of these important functions of the electrical circuit is given in connection with FIG. 5.

4. Item 150 in FIG. 1: Output Buffer (BUF)

Figure 6:
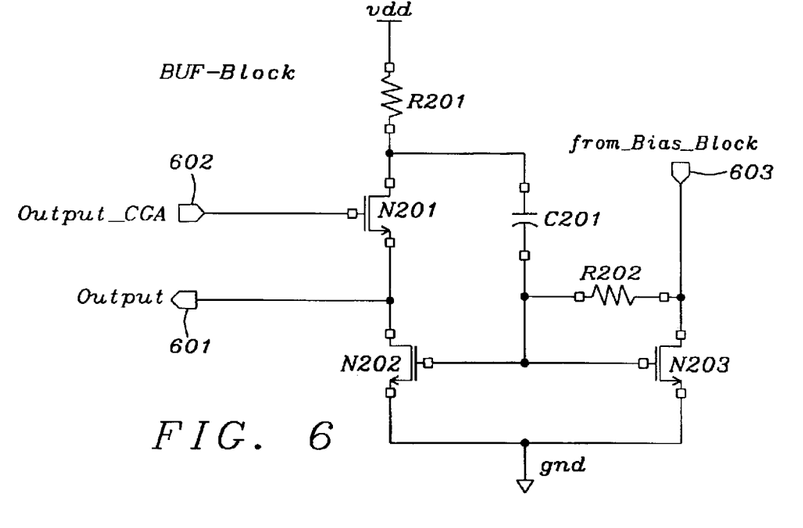
FIG. 6 presents the electrical circuit schematics for the fourth circuit block, named as output buffer circuit block.

The output buffer BUF is introduced in order to supply the load with the needed output power for the generated sinusoidal oscillator signal. Another main purpose of this circuit block is to isolate the core of the oscillator from the load. Isolation signifies in this context, that a varying output load shall have no influence on the generated oscillator signal. That is why the buffer has to have a low output impedance and at the same time the capability to deliver enough power for driving the needed loads. Also essential for this buffer is a good linearity and low noise, in order not to add additional phase-noise to the system. The electrical circuit schematics are depicted in FIG. 6.

5. Item 160 in FIG. 1: Bias Circuit (BIAS)

Figure 7:
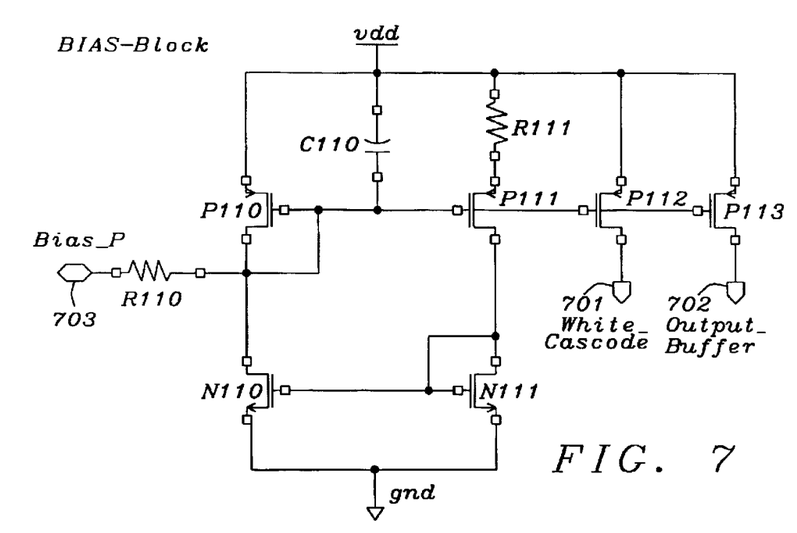
FIG. 7 presents the electrical circuit schematics for the fifth circuit block, comprising the bias currents generating circuits, called for short bias block.

The biasing circuit block generates the reference currents, which are further used for biasing the White cascode buffer WCB 109 and the output buffer BUF 110. The electrical circuit diagram is shown in FIG. 7.

In the following, each already in FIG. 1 shown and introduced circuit block is extensively explained, with the aid of its complete circuit schematics and additional diagrams for characteristic and relevant physical quantities. The novelties and advantages of the invention are listed for every circuit block.

Figure 2:
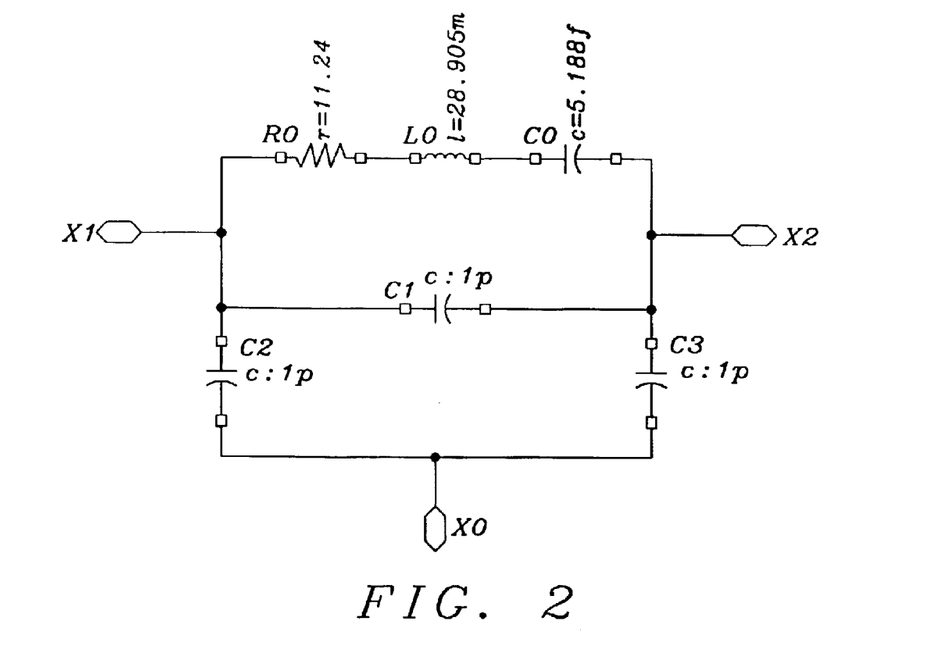
FIG. 2 shows the electrical equivalent circuit diagram for the crystal resonator, given here only for illustration of the invention. This electrical diagram could be significantly modified when different resonators or modelling techniques are used without affecting its importance for the invention. Equally the value of the invention and its applicability are not influenced thereby.
Figure 3A:
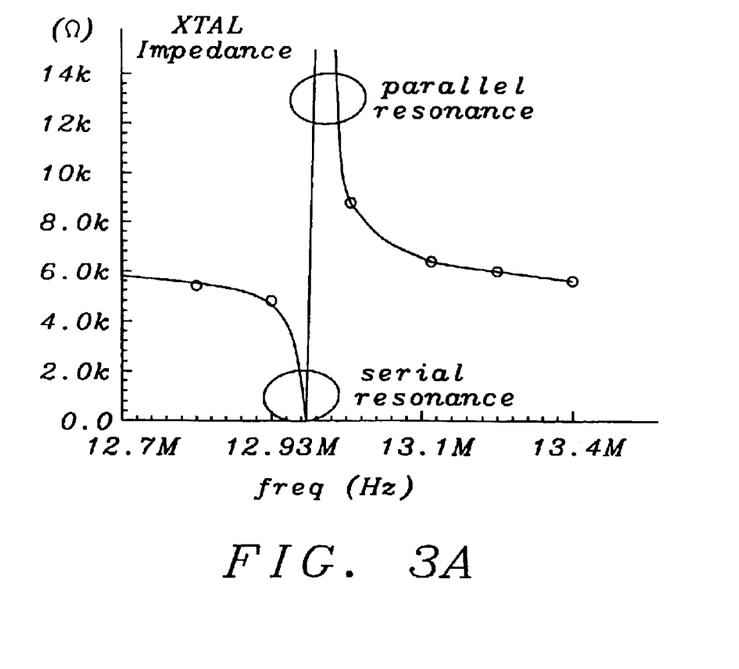
FIGS. 3A and 3B give pictures of the impedance curves in form of frequency diagrams. The two resonances presently illustrated—serial and parallel, which occur at about 13 MHz—are taken as an example. The invention however covers all similar resonance curves, which may extend from very low frequencies—for example with ceramic resonators in the range of only a few kHz—to very high frequencies—for example several GHz in the case of thin film resonators (TFR). The invention covers the whole frequency range.
Figure 3B:
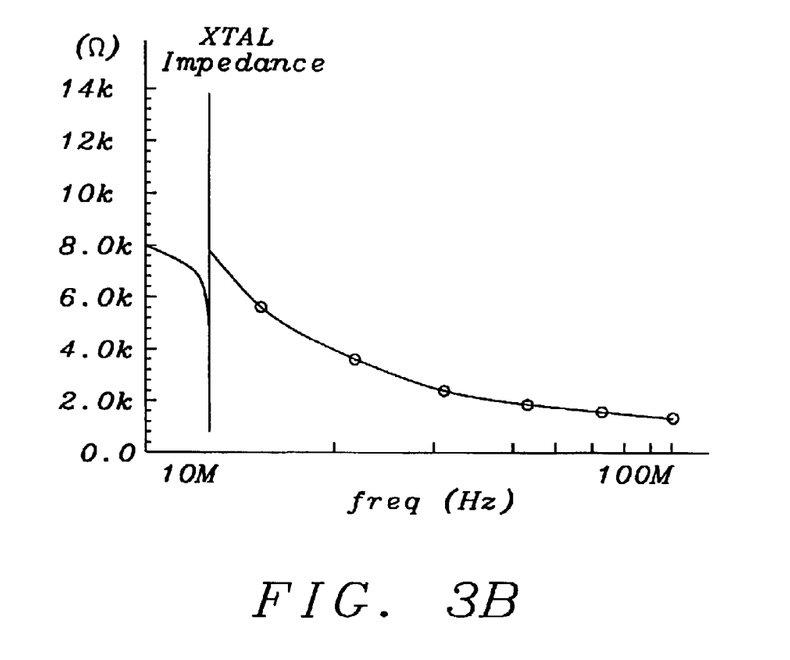

FIG. 2 shows the equivalent circuit diagram of a typical electrical model for a quartz crystal as used for the calculations within the simulation of the oscillator circuit. The crystal is essentially modeled as a three-pole network, consisting only of a few passive components, where:

$L_0$, $C_0$ and $R_0$ determine the serial resonance frequency of the quartz, $L_0$, $C_0$, $R_0$ and $C_1$ determine the parallel resonance frequency, and $C_2$ and $C_3$ represent the parasitic capacitances to ground for the crystal's plates and the package parasitics.

The poles or pins of the crystal are designated:

$X_1$, $X_2$—as active XTAL pins and $X_0$—as the ground XTAL pin.

To gain more Insight into and develop a feeling for the physics the components together with their typical numerical values—as received from the crystal manufacturer—are shown here:

| | | | |
|---|---|---|---|
| $-L_0$ | = | 28.906 | [mH] |
| $-C_0$ | = | 5.188 | [fF] |
| $-R_0$ | = | 11.24 | [Ω] |
| $-C_1$ | = | 1 | [pF] |
| $-C_2, C_3$ | = | 1 | [pF] |

(The influence of the two latter capacitances $C_2$ and $C_3$ is very often negligible, as they are connected in parallel to the terminal pairs $X_1$-$X_0$ and $X_2$-$X_0$).

As can be seen from FIG. 2 there are two possible resonances of the circuit (while neglecting the influence of $R_0$). One—the serial resonance—formed only with $L_0$ and $C_0$, the other—parallel resonance—formed with $L_0$ and $C_0$ together with $C_1$. Calculating the serial resonance frequency $f_{res(Serial)}$ according to the following formula $f_{res(Serial)}=(1/2\pi)*(L_0*C_0)^{-1/2}$ leads to $f_{res(Serial)}=13.0$ MHz.

Usually the manufacturer indicates the parallel resonance frequency of the quartz, but because of the XTAL's nature, both resonance frequencies are very close to each other. The distance $\Delta f = f_{res(Parallel)} - f_{res(Serial)}$ equals $\Delta f = f_{res(Serial)}*C_0/2C_1$ leading here to a $\Delta f=33.722$ kHz. The quality factor of the crystal is determined mainly from $L_0$ and $R_0$. The determining formulas are $Q=1/R_0*(L_0/C_0)^{-1/2}$ or $Q=1/(2\pi*f_{res(Serial)}*C_0*R_0)$ or else $Q=2\pi*f_{res(Serial)}*L_0/R_0$, thus a higher serial inductance and a lower serial resistance will lead to a higher quality factor. Calculating with the values from above leads to Q=210 000, which is very high. A high quality factor improves the phase noise performance of the circuit at close in offsets and decreases the carrier instability.

In FIGS. 3A and 3B the frequency diagrams of the equivalent impedance of the crystal XTAL, as used in our application, are shown. In FIG. 3B the depicted frequency range is extending from 10 MHz to 100 MHz, the very close to each other appearing resonance frequencies are thus emphasized also graphically. Whereas the diagram in FIG. 3A spreads the frequencies around the resonances, ranging from 12.7 MHz to 13.4 MHz. At the resonance frequency, when observing the case of serial resonance the lower one, the impedance is purely resistive and is equal to $R_0$. The basic idea behind the oscillators with serial type resonance is now to utilize exactly this frequency region, thus attaining approximately the same quality factor for the complete oscillator as is the quality factor Q of the crystal resonator. The general principle of operation is further described in the chapter dealing with the core of the oscillator; here only some special peculiarities will be emphasized.

Quartz characteristics (FIGS. 2. 3A & 3B) and novelty in crystal oscillator design:

The impedance at serial resonance frequency is purely resistive and equal to $R_0$. The phase shift at serial resonance frequency is equal to zero (important for satisfying the phase condition of oscillation). The equivalent impedance for frequencies higher than 13 MHz is of capacitive character determined by $C_1$. Most important in that context is that the absolute value of the impedance is decreasing and if this is not taken into account properly, it may cause high frequency signals e.g. of distortional origin be transmitted through the quartz itself. The core of the oscillator has to assure that such high frequency components are not generated, transmitted or amplified. In other words, there is a fundamental possibility of oscillation at higher frequencies, but the oscillator core circuit has to make sure, that at least one of the conditions for oscillation (amplitude and phase—see above) is not satisfied within reasonable security limits.

Figure 4:
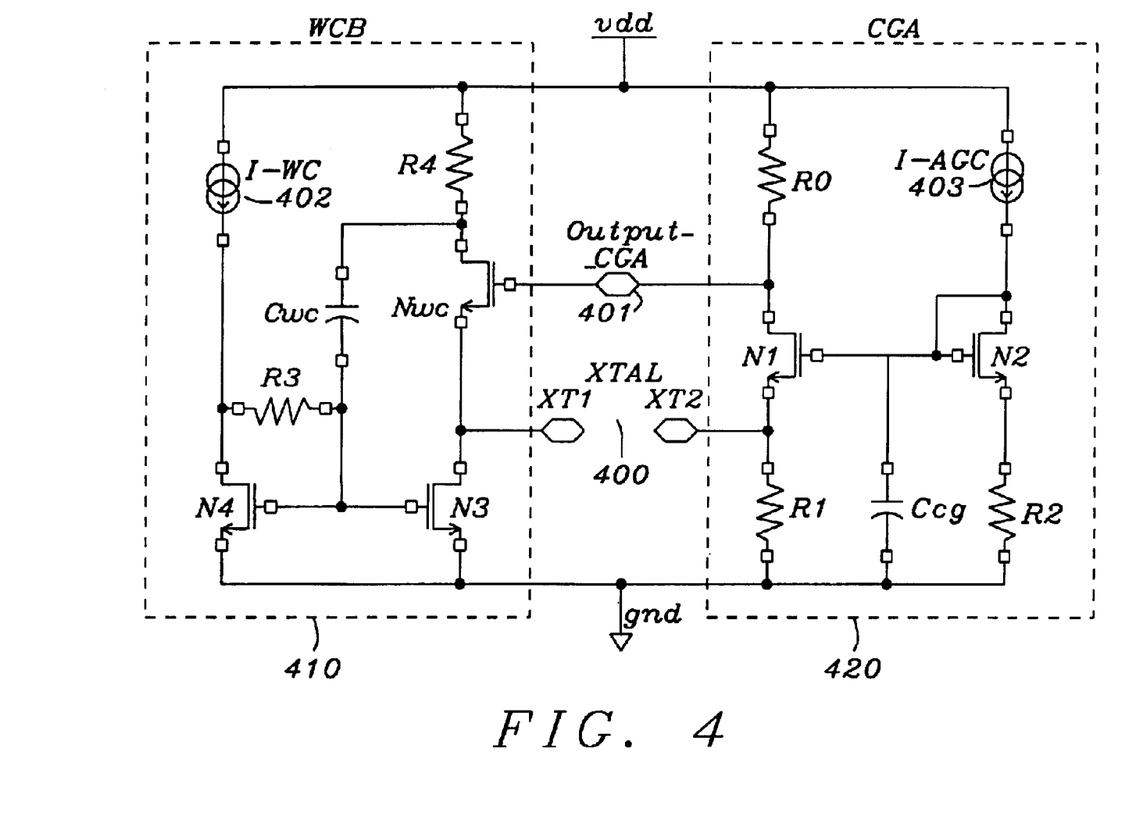
FIG. 4 presents the electrical circuit schematics for the first and second circuit blocks, forming—together with the crystal—the oscillator core.

FIG. 4 reveals the electrical circuit schematics of the modified Butler oscillator core.

The dashed lines in the diagram enclose the two blocks White cascode buffer WCB—item 410 to the left—and common gate amplifier CGA—item 420 on the right side. The crystal resonator 400 is connected between the output of the White cascode buffer WCB and the input of the common gate amplifier CGA. Because the buffer WCB and the amplifier CGA do not introduce additional phase shifting to the signal—voltage between XT1 and XT2—(assuming ideal components) the phase condition for oscillation will only be satisfied, if the XTAL keeps the same phase as the signal. In other words, this is only possible when the crystal operates in serial resonance mode and thus exhibits a purely resistive impedance. The satisfaction of the amplitude condition for oscillation is assured by controlling the gain of the common gate amplifier CGA.

The NMOS transistors $N_1$ and $N_2$; resistors $R_0$, $R_1$ and $R_2$; and capacitor $C_{cg}$ are forming the common gate stage CGA, where transistor $N_1$ is the main amplifying transistor and $N_2$ is the biasing mirror diode. Pin 401 carries the output signal Output_CGA of the oscillator and is directly connected with the input of the White cascode buffer circuit WCB. Capacitor $C_{cg}$ provides AC-ground for the gate of the amplifying transistor, the two transistors $N_1$ and $N_2$ are connected as a current mirror setting the quiescent current of transistor $N_1$.

Novelties and advantages of the oscillator core (FIG. 4) of the invention: The emitter follower from the transistorized (bipolar) original topology is replaced with a White cascode buffer WCB providing low output impedance. Additionally, the coupling between the buffer WCB and the amplifier stage CGA has been implemented as direct DC coupling. The capacitor of the original circuit is avoided. Analog and continuous active control of the amplifier gain has been implemented, while the original structure has fixed gain and an amplitude limiter. An effective reduction in size of the White cascode capacitor ($C_{wc}$) is also achieved All these measures together accomplish a better performance in terms of amplitude stability, distortion and phase noise. The usable frequency range of the circuit is equally extended. The attained reduction in overall capacitance values allows for a smaller Silicon chip area, which in turn leads to lower production costs.

Figure 5:
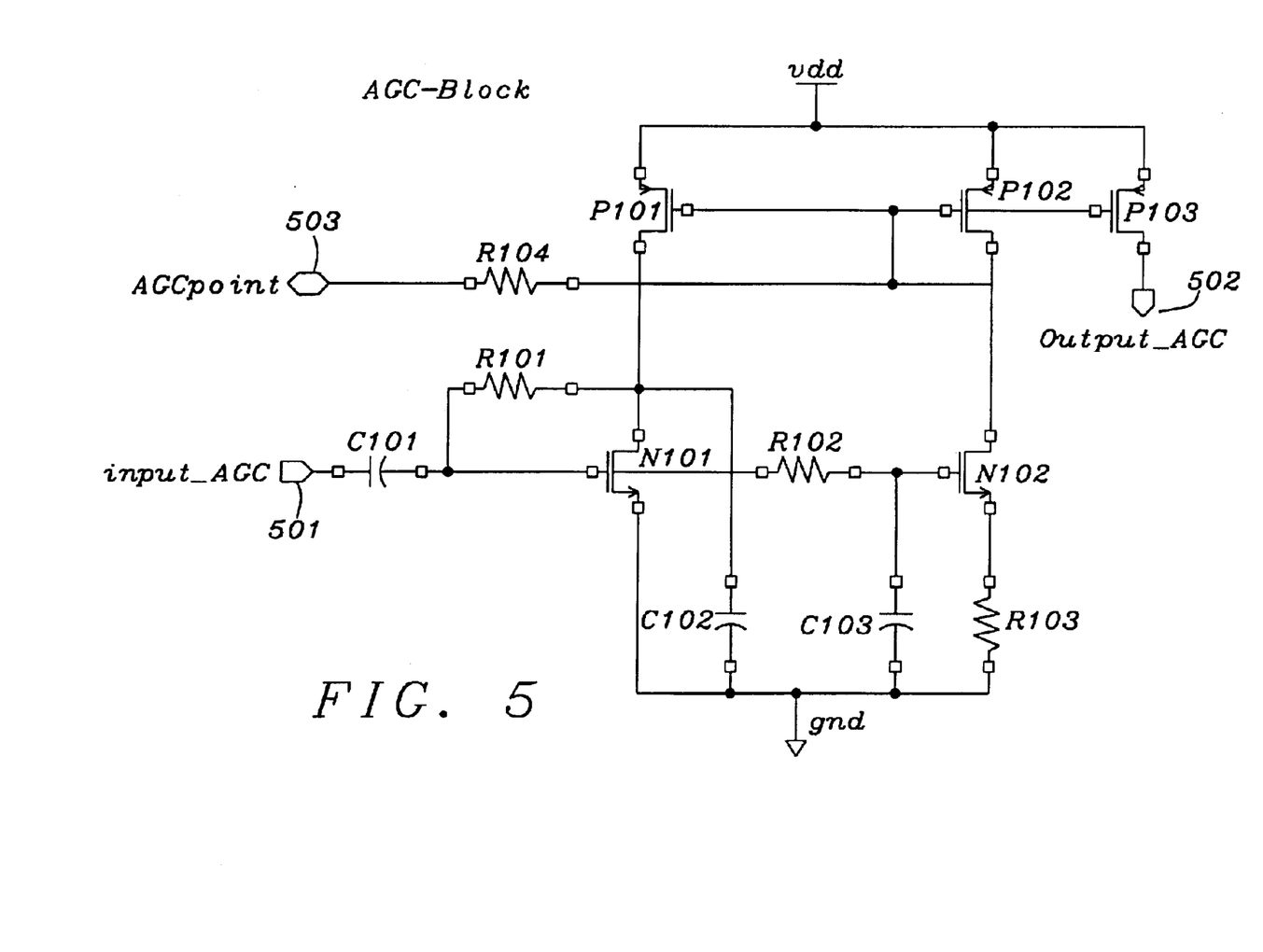
FIG. 5 presents the electrical circuit schematics for the third circuit block, called the automatic gain control circuit block.

Refering now to FIG. 5, the electrical circuit schematics of the automatic gain control block AGC for the amplitude control of the oscillator core signal are explained.

The input signal for the Input_AGC 501 is taken directly from the output signal Output_CGA (item 401 in FIG. 4) of the common gate amplifier CGA, which is a main advantage of this invention. Thereby the buffering amplifier BUF is kept far-off the neighborhood of the resonator, such preventing the sensitive XTAL from catching noise and interference signals. The output signal of the AGC Output_AGC 502 controls the quiescent current I-AGC (item 403 in FIG. 4) i.e. the gain of the amplifier CGA. Due to this feedback, the gain is set in a manner that a nearly sinusoidal output swing is guaranteed and at the same time the swing does not run too high to produce clipping effects on the signal. Equally, when there is no signal at all—at start-up of the oscillator—the gain is set to its maximum value and thus the start-up time of the oscillator is reduced. The DC regime or the maximum delivered current is determined only from NMOS transistors $N_{101}$, $N_{102}$, PMOS transistors $P_{101}$, $P_{102}$ and resistor $R_{103}$. Basically these 5 components work as a self-biased current reference identically to the structure described later (see BIAS and FIG. 7), with the difference that here the non-linear current mirror cell is manufactured with NMOS transistors. The resistors $R_{101}$ and $R_{102}$ do not affect the DC bias point. Because of the different DC levels the input has to be DC de-coupled with capacitor $C_{101}$. Resistor $R_{102}$ and capacitor $C_{103}$ form a low pass filter for the gate of transistor $N_{102}$ and depending on the input amplitude, the drain current of transistor $N_{102}$ is affected. Resistor $R_{101}$ increases the impedance of the diode connected transistor $N_{101}$ and establishing the DC regime it provides a "short" connection between the gate and the drain of $N_{101}$ realizing the current mirror. The resistor $R_{104}$ and the external pin AGCpoint are only for test purposes and they should be removed in the final version of the oscillator. The controlled output current (by the magnitude of the input signal Input_AGC) Output_AGC is further transferred with the current mirror $P_{102}$–$P_{103}$ and supplied to the common gate amplifier CGA at I-AGC (item 403 in FIG. 4).

Novelty of the automatic gain control circuit (FIG. 5): The main advantage of the used topology for automatic gain control AGC is mainly the possibility to generate a voltage controllable current with a very small total current consumption—in the order of $\mu A$. Another advantage is the possibility of operating in a wide range of frequencies.

FIG. 6 depicts the electrical circuit schematics of the output buffer BUF: The output buffer BUF uses the same White cascode architecture as already described for WCB with FIG. 4. The advantage of that topology is the good isolation between the core and the load and the diminished output impedance in comparison to a standard structure with the same quiescent current. In FIG. 6, transistor $N_{201}$ is the main buffering transistor; the transistors $N_{202}$ and $N_{203}$ are forming a current mirror establishing the DC bias point. A signal proportional to the output signal is taken from the resistor $R_{201}$ and fed to the gate of transistor $N_{202}$ through the capacitor $C_{201}$. Due to this feedback, the output impedance is effectively decreased consuming only a relatively small quiescent current for transistor $N_{201}$. The resistor $R_{202}$ is connected between the gate and the drain of $N_{203}$ thus increasing significantly the impedance of this diode connected NMOS transistor and as a further benefit of this connection, a very small feedback capacitor $C_{201}$ can be used. At the DC operation point, the resistor $R_{202}$ does not change the operation of the current mirror, because of the huge impedance of the transistor's gates. The value of the feedback components $R_{201}$ and $C_{201}$ have been optimized by parametric simulations finding the optimum performance and minimum occupied Silicon—area. The ratio of the current mirror has been chosen to be 1:10 reducing current consumption as much as possible, which is an essential part of the whole XTAL oscillator design. In order to achieve a low output impedance in connection with a low consumption, the aspect ratio W/L (width/length) of the transistor $N_{201}$ has been increased in comparison to $N_{202}$ in order to obtain a higher transconductance value $g_m$. For all transistors, the chosen channel length is bigger than the minimal possible value, in order to decrease the 1/f corner frequency and to have a lower phase noise floor.

FIG. 7 shows the electrical circuit schematics of the bias block BIAS. The biasing part of the XTAL oscillator provides the quiescent currents for the White cascode buffer WCB 701 and for the output buffer BUF 702 (the biasing of the common gate amplifier CGA is guaranteed by the automatic gain control block AGC).

The main biasing cell consists of the NMOS transistors $N_{110}$ and $N_{111}$ the PMOS transistors $P_{110}$ and $P_{111}$, and the resistor $R_{111}$ forming two current mirrors with different parameters and architectures working together. The pair of NMOS transistors has a linear dependence between input and output currents, because both transistors are working in their saturation regions. The PMOS transistor cell has a non-linear characteristic of the transfer function because of resistor $R_{111}$, which is connected as a negative feedback for transistor $P_{111}$. Now transistor $P_{111}$ is working in the weak-inversion region, where the standard equation for MOS transistors is not longer valid. Due to this phenomenon, the transfer function, as mentioned above, is non-linear and the crossing point of the two transfer curves determine the transistors' biasing point.

These method of crystal oscillator design has been used earlier by others, whereby the total loop gain of the basic crystal oscillators is also regulated using Automatic Gain Control (AGC) or amplitude regulation techniques. One such crystal oscillator having amplitude regulation is described in more detail in an article by Eric Viftoz and Jean Fellrath, entitled "CMOS Analog Integrated Circuits Based on Weak Inversion Operation", appearing in the IEEE Journal of Solid-State Circuits, Vol. SC-12, No. 3, published in June 1977, and hereby incorporated by reference. Crystal oscillators having amplitude regulation (or AGC) operate by lowering the input current (i.e., the bias current) until a steady state is achieved. The term AGC derives from the operation of the circuit, because the gain of the circuit is automatically controlled through a closed-loop regulation technique. Specifically, the total loop gain of the oscillator is not wasted and the unwanted side effects such as clipping, distortion and harmonics are reduced.

The disadvantage introduced within the above cited solution is however the tuned small band operation of the circuit, caused by additional filtering and a heavy capacitive coupling circuitry, which is avoided in the current invention.

Novelty in the biasing block circuit (FIG. 7):
The most important benefit of the structure in the invention is the very small loss of current while setting-up the current references. The reference currents for the White cascade buffer WCB and the output buffer BUF are generated with a system of current mirrors, consisting of three PMOS transistors $P_{110}$, $P_{112}$ and $P_{113}$. The resistor $R_{110}$ provides a connection to the external pin Bias_P 703, which is only used for testing purposes. The capacitor $C_{110}$ prevents disturbances coming from the oscillator by AC-grounding all the gates of the PMOS transistors.

The preferred embodiment of the present invention preferably comprises transistors, built with MOSFET technology, like resistors and capacitors implemented on a single integrated circuit device. By implementing the present inventive crystal oscillator as a monolithic integrated circuit device, the deleterious effects introduced by temperature variations are advantageously reduced or even nullified.

Additionally supplied are the following pictures (FIGS. 8A, 8B, 9, and 10), results of measurements and simulations, thus giving evidence of the performance of the new serial oscillator.

Figure 8A:
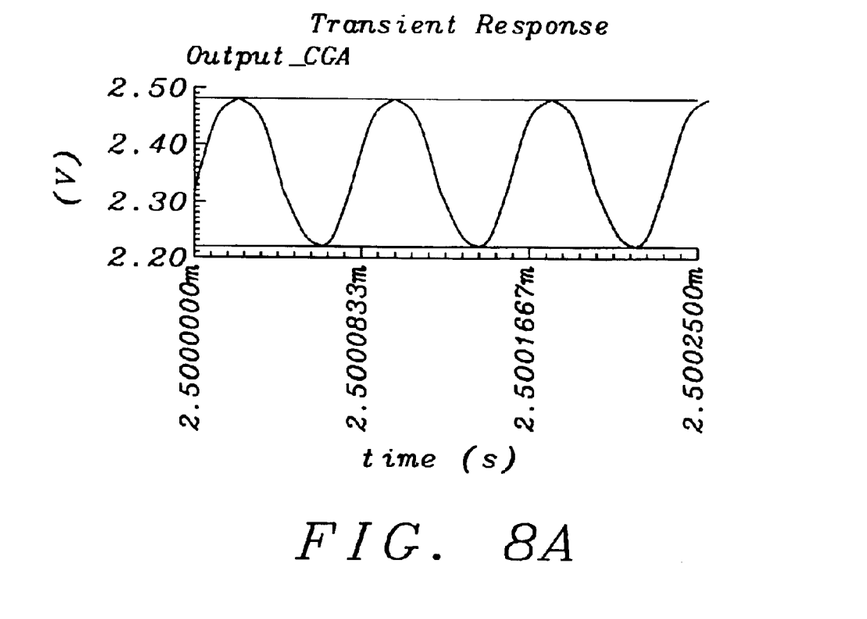
FIGS. 8A and 8B display the behaviour of the generated oscillator signal in form of simulation results.

Refering to FIG. 8A, the results of a computer simulation are shown. The generated signal in the oscillator core (output_CGA; item 401 in FIG. 4). Remarkable is the pretty good approximation to a sinusoidal signal, when compared to results of circuits with fixed gain and signal clipping, as already mentioned above.

Figure 8B:
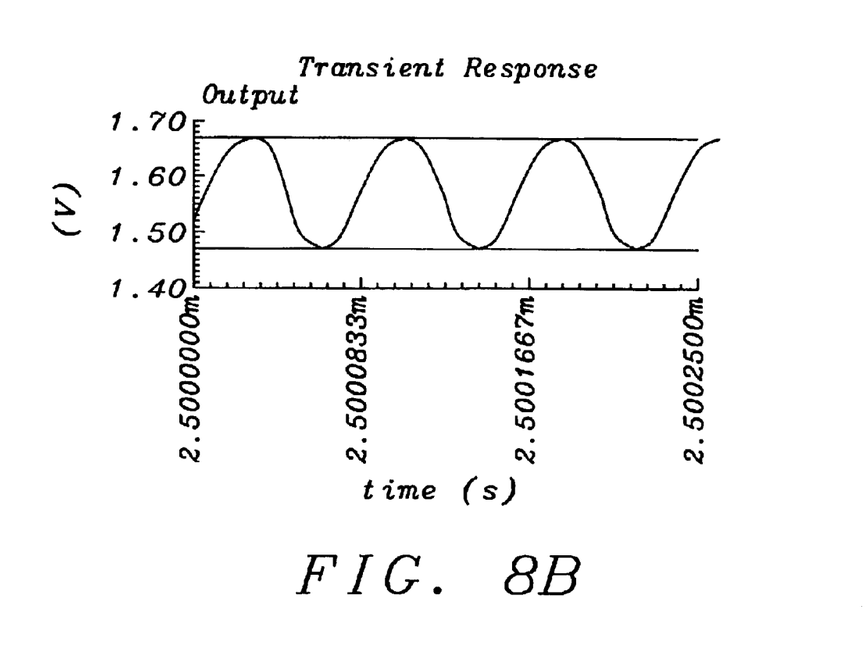

Refering to FIG. 8B, the results of a computer simulation are shown. The generated signal of the oscillator at the signal Output (item 601 in FIG. 6) of the output buffer BUF (loaded with a 1 kΩ resistance element). Remarkable is the similarity to the signal in FIG. 8A, i.e. no degradation caused by the power consumption of the load resistance element. The curves shown are signals from a transient simulation, which have already reached steady state, the time scale shows 2.5 ms and later (after start-up at zero). Even under worst case conditions i.e. with a heavy load of about 200Ω the start-up time remains still below 2.5 ms.

Figure 9:
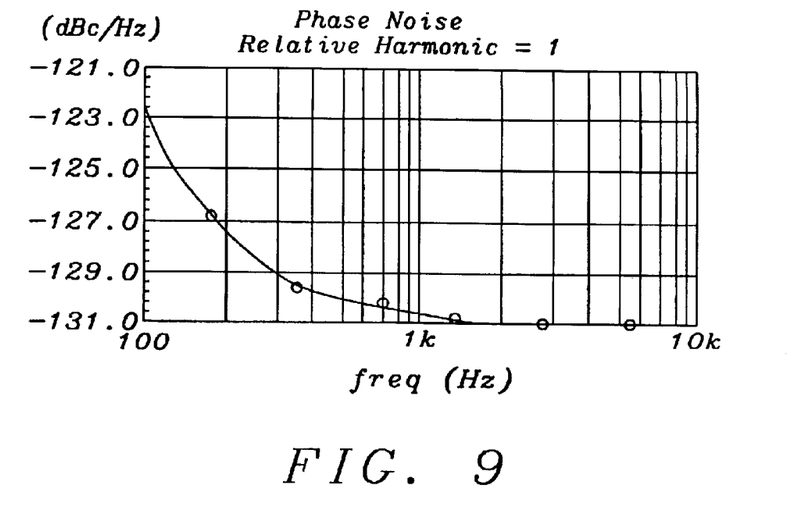
FIG. 9 illustrates the phase noise behaviour of the generated oscillator signal in form of a frequency diagram, showing the phase noise at different frequency offsets.

In FIG. 9 the frequency diagram of the phase noise is shown. The offset from oscillator carrier signal is hereby ranging from 100 Hz to 10 kHz. The load conditions are: resistor 1 kΩ with 50Ω resistor connected in series). The results of simulations and measurements here closely agree, even for such small offsets compared to the central frequency of 13 MHz.

Figure 10:
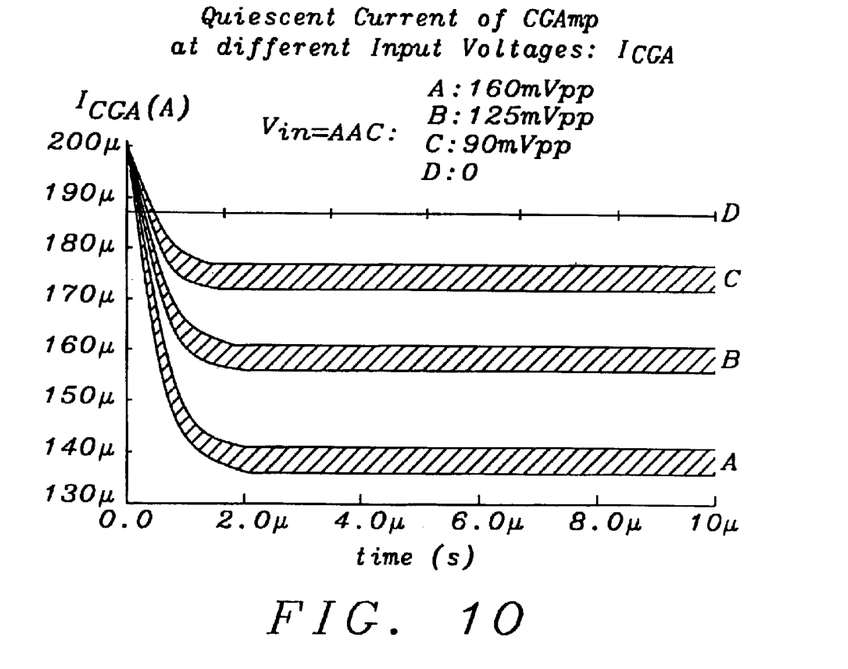
FIG. 10 depicts the function of the automatic gain control circuit in form of a time diagram with different control signal levels as parameter.

FIG. 10 depicts the performance of the automatic gain control circuit in form of a time diagram with control parameter voltage of AGC input signal. Shown is the transient behaviour of the quiescent current of transistor $N_1$ (see FIG. 4) for different voltage values of input signal Input_AGC (item 501 in FIG. 5). (Measurement conditions: feedback loop is open, impedance relations for normal operational conditions under measurement observed). Here again the results from the simulation and a practical implementation are similar.

Figure 11:
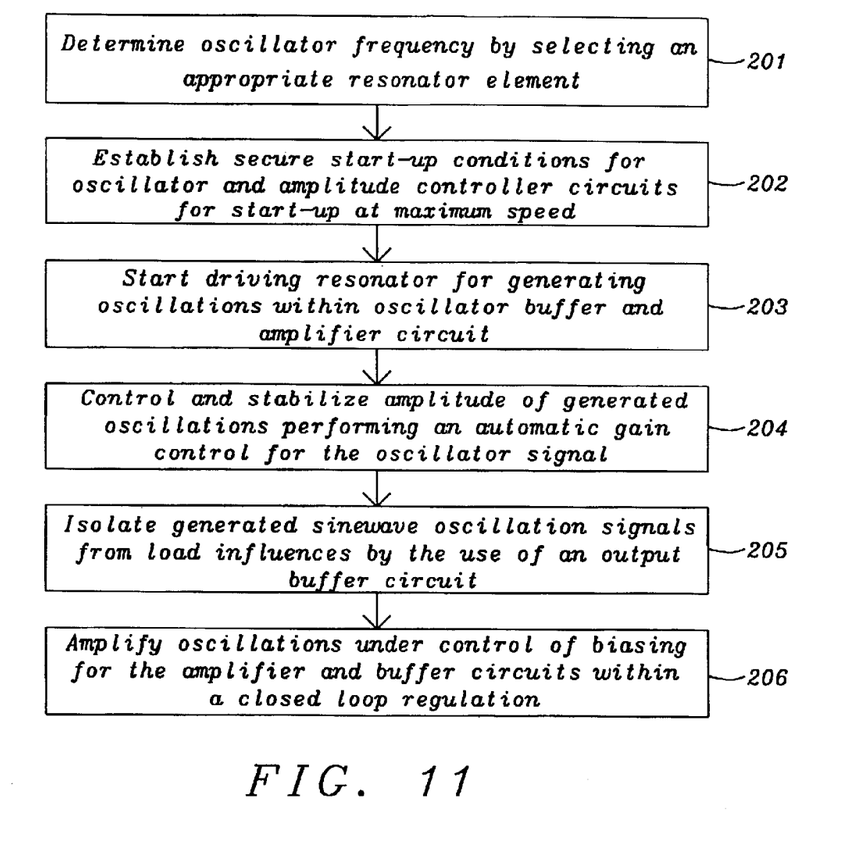
FIG. 11 illustrates the method how to generate the oscillations with the circuit of the invention.

FIG. 11 illustrates the method how to generate the oscillations with the circuit of the invention, as described and explained before.

As a first step 201 is described, how to determine the oscillator frequency by selecting an appropriate resonator element. With step 202 secure start-up conditions for oscillator and automatic amplitude controller circuits are established, to ensure start-up at maximum speed. Under step 203 driving the resonator for generating oscillations within oscillator buffer and amplifier circuit starts. Step 204 describes the control and stabilization of the amplitude of the generated oscillations performing an automatic gain control for the oscillator signal. Step 205 isolates the generated sinewave oscillation signals from load influences by the use of an output buffer circuit. In step 206 the oscillations are amplified under control of biasing for the amplifier and buffer circuits within a closed loop regulation.

As shown in the preferred embodiments and evaluated by simulations and measurements, the novel circuits provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A circuit, capable of generating a resonator controlled oscillator output signal, comprising:

means for generating an oscillating signal having a stable and predetermined oscillation frequency;

means for driving said oscillation generating means and for matching the impedance levels between said oscillation generating means and this driving means;

means for amplifying and controlling the generated oscillation signal of said oscillation generating means;

means for connecting said amplifying and controlling means to said driving means in a closed loop feedback fashion;

means, coupled between said driving means and said amplifying means for controlling the amplification factor (gain) of said amplifying means in such a way, that a steady oscillation signal is maintained;

means for isolating said amplified oscillation signal of said amplifying means from influences resulting from changing output loads at said isolating means; and means for generating the bias currents, based upon the supply voltage level, for said driving means and for said isolating means.

2. The circuit according to claim 1 wherein said oscillation generating means comprises a resonator circuit having a crystal resonator element that produces an oscillating signal having a predetermined oscillation frequency.

3. The circuit according to claim 2, wherein said crystal resonator element is being operated in serial resonance mode, thus exhibiting a purely resistive impedance value at resonance frequency.

4. The circuit according to claim 1 wherein said oscillation generating means comprises a resonator circuit fabricated using MEMS technologies.

5. The circuit according to claim 1 wherein said amplifying means comprises a common gate amplifier circuit.

6. The circuit according to claim 5, implementing said common gate amplifier comprising:

two commonly gated NMOS transistors;

two DC-grounded resistors and one DC grounded common gate capacitor;

one further resistor; and a controlled reference current source for the analog and continuous adjustable gain of the amplifier circuit.

7. The circuit according to claim 1 wherein said amplifying means comprises one pair of signal terminals, and one control terminal also used as bias current terminal.

8. The circuit according to claim 1, and as said amplifying means comprising:

a common gate amplifier circuit, with two input terminals—one signal and one control input—and one output terminal, for amplifying said generated oscillating signal from said oscillation generating means, fed into its signal input terminal and transmitted to its output terminal, whereas the control input terminal is controlled by the output signal of said controlling means; and one bias current terminal for the additionally necessary current reference.

9. The circuit according to claim 1 wherein said controlling means comprises an automatic gain control circuit.

10. The circuit according to claim 9, implementing said automatic gain controller, comprising:

two NMOS transistors and two PMOS transistors, for a self-biased current source;

three resistors and three capacitors for filtering, biasing and decoupling purposes; and one further PMOS transistor for supplying the amplifier gain control current.

11. The circuit according to claim 1 wherein said controlling means comprises two signal terminals, one for signal input and the other for signal output.

12. The circuit according to claim 1, and as said controlling means comprising:
- an automatic gain control circuit, with one input and one output terminal, where the input terminal is connected from two other terminals, the input terminal of said driving means together with the output terminal of said amplifying means; and where the output terminal is connected to the control input terminal of said amplifying means.

13. The circuit according to claim 1 wherein said biasing means comprises a dedicated bias circuit block.

14. The circuit according to claim 13, implementing said biasing block comprising:
- two DC-grounded NMOS transistors and three AC-grounded PMOS transistors, forming a system of current mirrors;
- one further PMOS transistor, working in nonlinear weak inversion mode;
- one negative feedback resistor; and
- one AC grounding capacitor.

15. The circuit according to claim 1 wherein said biasing means comprises two bias current output terminals.

16. The circuit according to claim 1, and as said biasing means comprising:
- a biasing circuit block, with two output terminals, one output terminal setting-up the current reference for said driving means and the other output terminal setting-up the current reference for said isolating means.

17. The circuit according to claim 1 wherein said driving means comprises a White cascode buffer circuit.

18. The circuit according to claim 17, implementing said White cascode buffer comprising:
- two DC-grounded NMOS transistors;
- one cascode NMOS-transistor;
- two resistors and one White cascode capacitor; and
- a reference current source for biasing purposes.

19. The circuit according to claim 18, where said White cascode capacitor is effectively minimized, in order to extend the usable frequency range and in order to save chip area.

20. The circuit according to claim 19, where said usable frequency range for operation of the circuit is extending from 1 MHz to about 50 MHz.

21. The circuit according to claim 1 wherein said driving means comprises one pair of signal terminals and one bias current terminal.

22. The circuit according to claim 1, and as said driving means comprising:
- a White cascode buffer circuit, with one signal input and one signal output terminal, for driving on its output terminal said oscillation generating means to generate said oscillating signal and where the input terminal is firstly connected via said connecting means to the input terminal of said amplifying means and secondly to the input terminal of said controlling means; and
- one bias current terminal for the additionally necessary current reference.

23. The circuit according to claim 1 wherein said isolating means comprises an output buffer circuit.

24. The circuit according to claim 23, implementing said output buffer comprising:
- two DC grounded NMOS transistors, forming a current mirror circuit;
- one further NMOS transistor for signal input amplification;
- two resistors and one White cascode capacitor; and
- a reference current source for biasing.

25. The circuit according to claim 24, where the current ratio within the current mirrors is as small as possible (e.g. 1:10), in order to minimize current consumption.

26. The circuit according to claim 24, where said White cascode capacitor is effectively minimized, in order to extend the usable frequency range and in order to save chip area.

27. The circuit according to claim 26, where said usable frequency range for operation of the circuit is extending from 1 MHz to about 50 MHz.

28. The circuit according to claim 1 wherein said isolating means comprises two signal terminals, one for signal input and the other for signal output; and one bias current terminal.

29. The circuit according to claim 1, and as said isolating means comprising:
- an output buffer circuit, with one input and one output terminal, where the input terminal is fed with said oscillating signal of the output terminal of said amplifying means and the output terminal itself establishing the output terminal of the whole oscillator circuit; and
- one bias current terminal for the additionally necessary current reference.

30. The circuit according to claim 1 wherein said connecting means comprises a direct connection lead as internal feedback loop from the output terminal of said amplifying means to firstly the input terminal of said driving means and secondly the input terminal of said gain controlling means.

31. The circuit according to claim 29, wherein said internal feedback loop connection is implemented as direct DC coupling; substantially avoiding capacitive components.

32. The circuit according to claim 1, and for said oscillation generating means and also said driving means and further said amplifying means comprising:
- a resonator circuit having a crystal resonator element that generates an oscillating signal having a predetermined oscillation frequency:
- a common gate amplifier circuit, with two input terminals—one signal and one control input—and one output terminal, for amplifying said generated oscillating signal from said oscillation generating means, fed into its signal input terminal and transmitted to its output terminal, whereas the control input terminal is controlled by the output signal of said controlling means;
- a White cascode buffer circuit, with one input and one output terminal, for driving on its output terminal said crystal resonator circuit to generate said oscillating signal; where the input terminal is firstly connected via said connecting means to the input terminal of said common gate amplifier circuit and secondly to the input terminal of said controlling means; and
- one terminal for the additionally necessary current reference.

33. The circuit according to claim 32, where said crystal resonator element is being operated in serial resonance mode, thus exhibiting a purely resistive impedance value at resonance frequency.

34. The circuit according to claim 32 connected together in said described manner and thus exhibiting one input terminal and two output terminals and designated as oscillator core circuit, with said input terminal to the purpose of controlling said amplifier gain, one output terminal used as control output terminal and the other output terminal used as signal output terminal, and where said signal output terminal is internally connected as feedback loop to said input terminal via said connecting means.

35. The circuit according to claim 34, implementing said oscillator core, wherein the internal feedback loop connection is implemented as direct DC coupling; substantially avoiding capacitive components.

36. The circuit according to claim 1, manufactured in monolithic integrated circuit technology.

37. The circuit according to claim 36, manufactured in monolithic integrated CMOS technology.

38. The circuit according to claim 36, where said oscillation generating means is mounted Off-Chip as a separate component.

39. The circuit according to claim 36, where said oscillation generating means is mounted On-Chip as an integrated component.

40. A method for generating a stable, amplitude controlled oscillation signal with an electronic device or technology, comprising:

providing a crystal resonator element for determining of the oscillator frequency;

providing a White cascode buffer circuit for driving the resonator element;

providing a common gate amplifier circuit for amplifying the oscillation signal;

providing an automatic gain control circuit for stabilizing the oscillation signal;

providing an output buffer circuit for isolating the oscillator circuit from load influences;

providing a bias block circuit for delivering the biasing reference currents for the buffer circuits;

controlling the closed loop generation of the oscillations.

41. The method according to claim 40 wherein said step of controlling the closed loop generation of the oscillations comprises:

connecting one pad of the crystal resonator element to said output terminal of said White cascode buffer circuit;

connecting the other pad of the crystal resonator element to said signal input terminal of said common gate amplifier circuit;

connecting said output terminal of said common gate amplifier circuit to the input terminal of said White cascode buffer circuit;

connecting the input terminal of said White cascode buffer circuit respectively the output terminal of said common gate amplifier circuit to said input terminal of said automatic gain control circuit;

connecting the output terminal of said automatic gain control circuit to said control input terminal of the common gain amplifier; and connecting said output terminal of said common gate amplifier to said input terminal of said output buffer.

42. The method according to claim 40 wherein said step of controlling the closed loop generation of the oscillations further comprises:

furnishing the adequate reference currents from said bias block circuit to said White cascode buffer circuit, respectively to said output buffer circuit.

43. The method according to claim 40 wherein said step of controlling the closed loop generation of the oscillations further comprises:

adjusting said output signal of said automatic control circuit in such a way, that quite correctly is accomplished the setting of the gain of said common gate amplifier to maximum at start-up of said crystal oscillator circuit, to efficiently speed up the transient processes at start-up of the crystal oscillator.

44. The method according to claim 40 wherein said step of controlling the closed loop generation of the oscillations further comprises:

adjusting said output signal of said automatic control circuit in such a way, that quite correctly is accomplished the setting of the gain of said common gate amplifier to such an appropriate value at steady state operation of said crystal oscillator circuit, that the amplitude distortions and the phase noise of said oscillator signal are minimized.

* * * * *